(12) United States Patent
Fietz et al.

(10) Patent No.: US 10,825,585 B2
(45) Date of Patent: Nov. 3, 2020

(54) SUPERCONDUCTING CONDUCTOR AND USE OF THE SUPERCONDUCTING CONDUCTOR

(71) Applicant: Karlsruher Institut für Technologie, Karlsruhe (DE)

(72) Inventors: Walter Fietz, Karlsruhe (DE); Michael J. Wolf, Karlsruhe (DE); Reinhard Heller, Karlsruhe (DE); Klaus-Peter Weiss, Karlsruhe (DE)

(73) Assignee: Karlsruher Institut für Technologie (DE)

( * ) Notice: Subject to any disclaimer, the term of this patent is extended or adjusted under 35 U.S.C. 154(b) by 0 days.

(21) Appl. No.: 15/752,235

(22) PCT Filed: Aug. 10, 2016

(86) PCT No.: PCT/EP2016/001368
§ 371 (c)(1),
(2) Date: Feb. 12, 2018

(87) PCT Pub. No.: WO2017/025189
PCT Pub. Date: Feb. 16, 2017

(65) Prior Publication Data
US 2018/0226178 A1    Aug. 9, 2018

(30) Foreign Application Priority Data
Aug. 12, 2015 (DE) .................. 10 2015 010 636

(51) Int. Cl.
*H01B 12/06*    (2006.01)
*B23K 1/19*     (2006.01)
(Continued)

(52) U.S. Cl.
CPC .............. *H01B 12/06* (2013.01); *B23K 1/19* (2013.01); *H01B 13/0036* (2013.01);
(Continued)

(58) Field of Classification Search
CPC ............ H01F 41/0206; H01F 41/0213; H01F 41/022; H01B 12/06; H01B 13/0036;
(Continued)

(56) References Cited

U.S. PATENT DOCUMENTS 2,288,855 A * 7/1942 Krueger ............... H01F 27/25
                                                      29/605
2,431,155 A * 11/1947 Woolfolk ............. H01F 27/25
                                                       336/212
(Continued)

FOREIGN PATENT DOCUMENTS

JP           3657397 B2 *  6/2005    ............. H01B 12/10

OTHER PUBLICATIONS

Fabrication Trials of round strands composed of coated conductor tapes, D. Uglietti, IEEE Transactions on Applied Superconductivity, vol. 23, No. 3, Jun. 2013 (Year: 2013).*

(Continued)

*Primary Examiner* — Paresh H Paghadal
(74) *Attorney, Agent, or Firm* — Klarquist Sparkman, LLP (57) ABSTRACT

A superconductive conductor and method of using the superconductive conductor is described. The superconductive conductor includes a plurality of first conductive strips with a first width and a plurality of second conductive strips with a second width, and a strip stack formed from the first and second conductive strips that has a cruciform-shaped cross section.

14 Claims, 10 Drawing Sheets

(51) Int. Cl.
  *H01B 13/00* (2006.01)
  *H01L 39/14* (2006.01)
  *H01L 39/24* (2006.01)
  *H01R 4/68* (2006.01)
  *H02G 15/34* (2006.01)

(52) U.S. Cl.
  CPC ........ *H01L 39/143* (2013.01); *H01L 39/2419* (2013.01); *H01R 4/68* (2013.01); *H02G 15/34* (2013.01); *Y02E 40/642* (2013.01)

(58) Field of Classification Search
  CPC ...... H02G 15/34; H01R 4/68; H01L 39/2419; H01L 39/143
  See application file for complete search history.

(56) References Cited

U.S. PATENT DOCUMENTS

| | | | | |
|---|---|---|---|---|
| 2,498,747 | A * | 2/1950 | Wiegand | H01F 41/02 336/212 |
| 3,137,832 | A * | 6/1964 | Hurt, Jr. | H01F 27/245 336/234 |
| 3,333,220 | A * | 7/1967 | Fischer | H01F 27/362 336/84 R |
| 3,708,606 | A * | 1/1973 | Shattes | H01B 12/10 174/15.5 |
| 4,994,633 | A * | 2/1991 | Puhn | H01F 6/06 174/125.1 |
| 5,632,259 | A * | 5/1997 | Konda | F02P 3/02 123/634 |
| 5,929,000 | A * | 7/1999 | Hahakura | H01B 12/02 174/125.1 |
| 6,256,521 | B1 * | 7/2001 | Lee | C30B 11/00 505/230 |
| 6,271,474 | B1 * | 8/2001 | Fujikami | H01L 39/248 174/125.1 |
| 6,563,413 | B1 * | 5/2003 | Ponweiser | H01F 27/323 174/120 R |
| 6,621,966 | B2 * | 9/2003 | Lail | G02B 6/4411 385/109 |
| 2010/0026436 | A1 * | 2/2010 | Steinberger | H01F 27/245 336/96 |
| 2010/0099570 | A1 * | 4/2010 | Takayasu | H01B 12/02 505/163 |

OTHER PUBLICATIONS

International Search Report, dated Nov. 30, 2016, for related PCT Application No. PCT/EP2016/001368, 2 pages.
Wolf et al., "HTS CroCo: A Stacked HTS Conductor Optimized for High Currents and Long-Length Production," *IEEE Transactions on Applied Superconductivity*, 26(2): 19-24, Mar. 1, 2016.

* cited by examiner

Figure 1

Prior art

SUPERCONDUCTING CONDUCTOR AND USE OF THE SUPERCONDUCTING CONDUCTOR

CROSS REFERENCE TO RELATED APPLICATIONS

This is the U.S. National Stage of International Application No. PCT/EP2016/001368 filed Aug. 10, 2016, which in turn claims the benefit of German Patent Application No. 10 2015 010 636.8, filed Aug. 12, 2015. German Patent Application No. 10 2015 010 636.8 is incorporated herein in its entirety.

The invention refers to a superconductive conductor as well as a use of a superconductive conductor.

Superconductors are materials whose electrical resistance completely disappears below a specific temperature. As a consequence, superconductors do not have any electrical DC losses provided that they are operated at sufficiently low temperatures. A conductor for transporting electricity or a coil made of such superconductive materials consequently does not exhibit any DC losses. Thus electricity can be transferred very efficiently via such a conductor. In particular, high magnetic fields can be produced very efficiently with superconductive magnets. Low-temperature and high-temperature superconductors are distinguished according to the value of the temperature of the phase transition from the superconductive to the normal conductive state. With low-temperature superconductors this is typically under 30 K, with high-temperature superconductors in part significantly higher, e.g. above the boiling point of nitrogen (T=−196° C.). For this reason high-temperature superconductors (HTS) are also discussed for further applications since—compared to low-temperature superconductors—the effort of cooling is significantly reduced. This includes among others energy transmission, rotating machines, such as generators, engines, etc., or magnets, such as NMR or particle accelerators.

High-temperature superconductors made of Rare Earth Barium Copper Oxide (abbreviated REBCO) are the most interesting HTS materials available on the market at present with regard to the field and temperature range as well as current density. However, they are produced as thin strips or ribbons onto which the superconductor is deposited with a thickness of approximately 1 µm, so that a strip with a typical thickness of 100 µm with a width in the millimeter range is produced. No classic stranding techniques for producing cables of high ampacity can be used for these flat strips, so that new approaches are required for producing electrical conductors or cables, respectively, for higher currents out of the superconductors.

In transferring high electrical powers by means of superconductors the conductors must be cooled appropriately. In this respect it is desirable to keep the volume to be cooled as low as possible, i.e. to achieve high current densities in the bundle or cable, respectively. A high power density is also desired in the production of high fields in large magnets. At the same time a high mechanic stability of the cables is required, for instance with regard to mechanical support with lowest possible heat input, thermic cycles or electromagnetic forces.

For this reason it is a task of the present invention to provide superconductive conductor which is compact, mechanically stable and designed for high current densities. Moreover, it is one task of the present invention to indicate a use of the superconductive conductor.

This task is solved by the subject matters of the independent claims. Advantageous embodiments are subject matter of the dependent claims.

A first independent aspect for the solution of the task concerns a superconductive conductor, comprising:
- a plurality of first conductive strips or ribbons, each having a first width;
- a plurality of second conductive strips or ribbons, each having a second width;
- wherein the first width differs from the second width,
- wherein the plurality of first conductive strips and/or the plurality of second conductive strips comprises at least one superconductive strip,
- wherein the plurality of first conductive strips and the plurality of second conductive strips are arranged or stacked, respectively, to a strip stack with cruciform cross-section, and
- wherein in each case two conductive strips being successive in the strip stack are soldered to each other so that a superconductive body is formed out of the strip stack.

By a conductive or electrically conductive strip, respectively, in general a flat, electrically conductive strip is meant, having for instance a thickness of approximately 100 µm and for instance a width of approximately 2 mm to 12 mm. The length of a conductive strip can be for instance 1 m to 1 km or more, depending on the application. A conductive strip can in particular be a metal strip, such as a copper strip. In other words, the conductive strip can in part or completely be made of metal, such as copper. A conductive strip, however, can also be superconductive. In other words, a conductive strip can be a superconductive strip.

A superconductive strip is a strip comprising a substrate onto which a superconductor, in particular a high-temperature superconductor such as REBCO, is deposited as a thin layer, for instance with a thickness of approximately 1 µm. The substrate can for instance have a thickness of approximately 100 µm. Thus a superconductive strip also has a thickness of approximately 100 µm and can for instance have a width of approximately 2 mm to 12 mm. The length of a superconductive strip can be for instance 1 m to 1 km or more, depending on the application. Needless to say that other values are also possible. The first and second superconductive strips preferably are high-temperature superconductive strips.

The superconductive conductor comprises a plurality of first conductive strips and a plurality of second conductive strips, wherein in each case a first conductive strip differs in width from a second conductive strip. Each of the first conductive strips has the same width, namely a first width. Correspondingly, also each of the second conductive strips has the same width, namely a second width, which differs from the first width.

Preferably the plurality of first conductive strips comprises at least one first superconductive strip, having the first width. Preferably the plurality of first conductive strips comprises two or more first superconductive strips each having the first width. More preferably all first conductive strips are first superconductive strips each having the first width.

Preferably the plurality of second conductive strips comprises at least one superconductive strip, having the second width. Preferably the plurality of second conductive strips comprises two or more second superconductive strips each having the second width. More preferably all second conductive strips are second superconductive strips each having a second width.

In particular, the superconductive conductor comprises a plurality of first superconductive strips and a plurality of second superconductive strips, wherein in each case a first superconductive strip differs in width from a second superconductive strip. Each of the first superconductive strips has the same width, namely a first width. Correspondingly, also each of the second superconductive strips has the same width, namely a second width, differing from the first width.

Width of a conductive strip or superconductive strip, respectively, is defined as the distance of opposite end or length edges, respectively, of the strip, wherein the end or length edges, respectively, extend along the strip, i.e. correspond to the long edges of the strip. The width of the conductive strip or superconductive strip, respectively, is always smaller than the length of the conductive strip or superconductive strip, respectively. Compared to the width and length of the superconductive strip, the thickness of the superconductive strip is defined as the dimension of the superconductive strip in the direction of the transition of the substrate to the superconductor.

Preferably the electrical conductor exclusively comprises first and second conductive strips. In particular superconductive strips, i.e. conductive strips or superconductive strips, respectively, with the first width and conductive strips or superconductive strips, respectively, with the second width. In other words, the electrical conductor preferably comprises no conductive strips or superconductive strips, respectively, with other widths than the first and second width. In particular, the first width is larger than the second width. For instance, the first width can be ca. 6 mm and the second width ca. 4 mm.

The plurality of first conductive strips and the plurality of second conductive strips are arranged in a stacked shape or to a strip stack with cruciform cross-section, respectively. Respectively successive conductive strips of the strip stack are connected or soldered to each other, respectively. By means of soldering, successive conductive strips are joined or connected to each other in particular mechanically and electrically. Soldering as defined by this specification means in general a thermal joining, i.e. a joining by means of heating, or a thermal procedure for a positive substance joining of materials. The soldered strip stack as defined by the present invention is also designated as superconductive body and forms at least a part of the superconductive conductor.

The superconductive body or electrical conductor, respectively, is also called cross conductor, abbreviated CroCo, due to the cruciform cross-section as defined by the invention. By means of the cross conductor according to the invention advantageously the outer circular cross-section of a round conductor can be better produced than in superconductor stacks implemented up to now. At the same time, it is easy to produce the cross conductor. The exploitation of the cross-section is improved compared to a strip stack which merely has conductive strips or superconductive strips, respectively, with a single width. In this way, advantageously the current density through the conductor can be improved.

In order to exploit the cross-section of the conductor as much as possible the cross or cruciform cross-section, respectively, of the strip stack or the superconductive body, respectively, preferably has a virtually fourfold symmetry of the outer shape. The dimensions of the cross or the cruciform cross-section, respectively, perpendicular to the strip surfaces of the stacked conductive strips or superconductive strips, respectively, preferably correspond to the widths of the conductive strips or superconductive strips, respectively.

In particular, the cross has four first edges and eight second edges, wherein in each case the length of the four first edges preferably essentially corresponds to the second width of the second conductive strips or superconductive strips, respectively, and/or the length of the eight second edges in each case preferably essentially corresponds to half the difference of first width and second width.

Preferably the first and second width of the conductive strips or superconductive strips, respectively, are selected in such a way that the following applies for the relationship between the first width $b_1$ and the second width $b_2$:

$$0.6 < b_2/b_1 < 0.7 \qquad (1).$$

For instance, the superconductive conductor comprises in total 30 to 36 conductive strips or superconductive strips, respectively, wherein each has a thickness of ca. 150 µm to 165 µm. In this, preferably two thirds, i.e. about 20 to 24 of the strips, are first conductive strips or superconductive strips, respectively, with a first width, and one third, i.e. about 10 to 12 of the strips, are second conductive strips or superconductive strips, respectively, with a second width.

In a preferred embodiment the strip stack forming the superconductive body merely or exclusively, respectively, consists of strips with two different widths. In other words, the strip stack is exclusively comprised of first conductive strips with the first width and second conductive strips with the second width. In other words, the strip stack exclusively comprises (apart from e.g. the soldering paste joining the strips with each other) first conductive strips with the first width and second conductive strips with the second width, or the strip stack exclusively consists of first conductive strips with the first width and second conductive strips with the second width, respectively. Thus, the strip stack does not have any other strips than the first and second conductive strips. In other words, the strip stack does not have strips with widths deviating from the first and second width.

In another preferred embodiment the strip stack or the superconductive body, respectively, comprises or consists of, respectively, a middle section and two end sections, wherein the middle section is arranged directly between the two end sections and wherein the middle section exclusively comprises first conductive strips or superconductive strips, respectively, and the end sections each exclusively comprise second conductive strips or superconductive strips, respectively.

That the middle section is directly arranged between the two end sections means that the end sections in each case are seamlessly located adjacent to the middle section, i.e. without any further intermediate sections. In other words, the strip stack or superconductive body, respectively, does not comprise any further sections than the middle section and the two end sections.

In particular the middle section has a plurality of, for instance twenty, first conductive strips or superconductive strips, respectively, and each of the two end sections has a plurality of, for instance five, second conductive strips or superconductive strips, respectively. It goes without saying that the respective number of first and second conductive strips or superconductive strips, respectively, can be selected according to the application and/or desired type of electrical conductor. Preferably, the second width of the second conductive strips or superconductive strips, respectively, i.e. the conductive strips or superconductive strips, respectively, which are arranged in the end sections of the strip stack or the superconductive body, respectively, is smaller than the first width of the first conductive strips or superconductive strips, respectively, which are arranged in the middle section of the strip stack or the superconductive body, respectively. In this way, the result is the cruciform cross-section of the strip stack or superconductive body, respectively, already described above. Though it would be possible in principle to implement the superconductive body or electrical conductor, respectively, out of conductive strips or superconductive strips, respectively, with more than two different widths, which would lead to an even better exploitation of the cross-section. However, in the framework of the present invention it has shown that this leads to a significant increase in expenditures of manufacturing and compromises the twistability of the conductor. The cross conductor according to the invention, which has exactly two different conductive strips or superconductive strips, respectively, with exactly two different widths in each case, in contrast guarantees a high exploitation of the cross-section with a good twistability and significantly lower expenditure of manufacturing at the same time.

In a preferred embodiment the superconductive conductor further comprises a cladding tube apart from the superconductive body. In particular, preferably the superconductive body is enclosed by a cladding tube. The type or material, respectively, of the cladding tube in particular depends on the use.

The cladding tube can for instance be made of copper or aluminum or brass or iron or a combination or alloys of these. Thus, advantageously an additional conductivity can be provided for the quench case.

Alternatively or additionally the cladding tube can also be made of stainless steel or similar materials. This provides the superconductive conductor with a particular stability.

Alternatively or additionally the superconductive conductor preferably comprises one or more fittings which are arranged in the cladding tube together with the superconductive body. In this way, it is possible to give the superconductive body essentially a circular shape in an easy way despite the cruciform strip stack. The embodiment of an essentially round conductor, i.e. a conductor with an essentially circular cross-section, has the advantage of an easier usability. Moreover, the superconductive body can be protected by the fittings and cavities within the cladding tube can be filled.

Alternatively or additionally the superconductive conductor preferably comprises one or more metal wires, in particular the superconductive body is preferably enclosed or wrapped, respectively, by one or more metal wires. If the superconductive body for instance is wrapped by e.g. wires made of copper, aluminum, brass or a combination of copper, aluminum and brass, in this way additionally the superconductive body can be protected. At the same time wrapping the superconductive body with metal wires can contribute to the conductivity in a quench case, by the current being able to flow through an additional normal conductor in such a case.

Alternatively or additionally the superconductive body preferably comprises one or more steel wires. If the superconductive body is wrapped by steel wires, thus the conductivity between superconductive body and cladding tube can be decreased.

Alternatively or additionally the superconductive body preferably comprises an insulating material. If the superconductive body is wrapped with an insulating material, e.g. Kapton, thus the superconductive body can be insulated from the cladding tube.

In a preferred embodiment the strip stack or superconductive body, respectively, has a twisting. In particular, the stacked conductive strips or superconductive strips, respectively, are twisted with each other.

A twisting of the strip stack or superconductive body, respectively, is desirable in particular if currents with an alternating current component are to flow though the superconductive conductor. Further, a twisting is advantageous if the conductor must be bent as for instance in case of winding a magnet. In this case, without the twisting an externally located strip of the conductor would be strongly expanded and an internal strip of the conductor strongly compressed. If, however, the conductor is twisted, expansion and compression cyclically alternate.

Another independent aspect for the solution of the task refers to a use of the superconductive conductor according to the invention for the transmission of energy or power, respectively, or for the generation of magnetic fields.

In particular, the superconductive conductor according to the invention can be used for the transmission of high currents, e.g. in the area between 10 kA to 100 kA or more, e.g. from a power plant to an aluminum melt, when connecting a wind power station to the power network or in the remote transmission of high electrical powers, in particular in areas in which local overhead lines are not suitable. Due to the high currents or the high current densities, respectively, which can flow in the superconductive conductor according to the invention it is possible to use the superconductive conductor according to the invention for generating high magnetic fields, for instance for particle accelerators.

Alternatively, the superconductive conductor according to the invention can be used for forming a cable which is suitable for the energy transmission and/or the generation of high magnetic fields.

Preferably, a cable is formed or assembled, respectively, out of a plurality of superconductive conductors according to the invention, in particular out of one or more twisted combinations of the superconductive conductors. In this way, the ampacity can be adapted corresponding to the desired application.

Preferably such a bundle or cable is formed as a round cable. This has the advantage that there are no explicitly indicated preferred directions in the use due to the external shape of the cable.

In particular, it is possible to dispose a number of conductors adapted to the current to be transferred around a central tube or a suitable mounting for the use of the superconductive conductor according to the invention for the energy transmission or the generation of high magnetic fields, respectively, so that the stray field of the individual conductors is minimized. Preferably, cooling agent can be pumped through the tube in order to cool the superconductors.

The superconductive conductor according to the invention can also be used for forming a bent cable by heating the superconductive conductor locally, in particular to or above, respectively, the melting temperature of the solder or soldering agent, respectively, used in the superconductive conductor in order to bend the superconductive conductor. In the heated state the soldering agent advantageously allows a local displacement of the conductive strips or superconductive strips among each other.

For instance, the superconductive conductor can be heated inductively through eddy currents or hot air in order to obtain the flexibility of the individual superconductor strips again when bending. Thus, tensions in the conductive strips or superconductive strips, respectively, during bending can be largely reduced or avoided. The length across which the soldering agent is melted preferably is at least one twist pitch of the twisting of the superconductive body. In this way, advantageously different lengths of run of the individual strips can be balanced, which in particular occur due to the different length of run between an interior side and an exterior side of the superconductive conductor when bending.

The remarks above or below regarding the embodiments of the first aspect also apply to the above mentioned further independent aspect and in particular for preferred embodiments in this regard. In particular, for an independent aspect of the present invention and for preferred embodiments in this regard also the remarks above or below regarding the embodiments of the respective other aspects apply.

In the following, individual embodiments for solving the task are described exemplarily by means of the figures. In it, the individual described embodiments in part have features which are not absolutely necessary in order to implement the claimed subject matter, which, however, provide desired features in specific applications. Thus also embodiments are to be considered as disclosed by the described technical teaching which do not have all features of the embodiments described in the following. Moreover, in order to avoid unnecessary repetitions, specific features are only mentioned with regard to individual of the embodiments described in the following. It is pointed out that the individual embodiments therefore shall not only be considered separately but also in combination. The skilled person will recognize from this combination that individual embodiments can also be modified by including individual or several features of other embodiments. It is pointed out that a systematic combination of individual embodiments with individual or several features, which are described with regard to other embodiments, can be desirable and reasonable, and shall thus be taken into account as well as considered as covered by the specification.

BRIEF DESCRIPTION OF THE DRAWINGS

FIG. 4b shows a schematic perspective image of the superconductive conductor according to the invention of FIG. 4a;

FIG. 5b shows a schematic perspective image of the superconductive conductor according to the invention of FIG. 5a;

FIG. 6b shows a schematic perspective image of the superconductive conductor according to the invention of FIG. 6a;

FIG. 7b shows a schematic perspective image of the superconductive conductor according to the invention of FIG. 7a;

DETAILED DESCRIPTION OF THE DRAWINGS

The position specifications selected in the present application, such as above, below, lateral, etc., in each case refer to the directly described and illustrated figure and, in case of a change of position, are to be transferred analogously to the new position.

Figure 1:
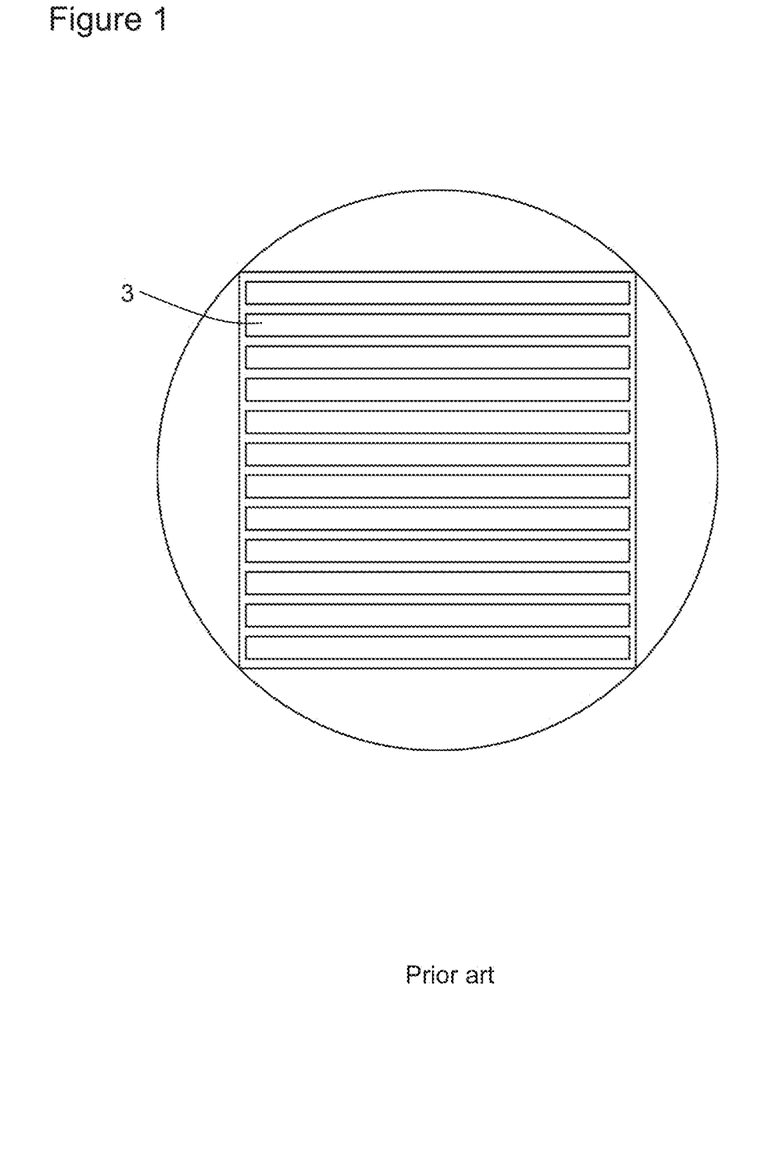
FIG. 1 shows a schematic image of the cross-section of a traditional superconductive conductor with stacked flat superconductive strips.

FIG. 1 shows a schematic image of the cross-section of a traditional superconductive conductor. The conductor comprises several superconductive strips 3, each having the same width and being stacked onto each other. The cross-section of the stacked superconductive strips 3 is square.

Figure 2A:
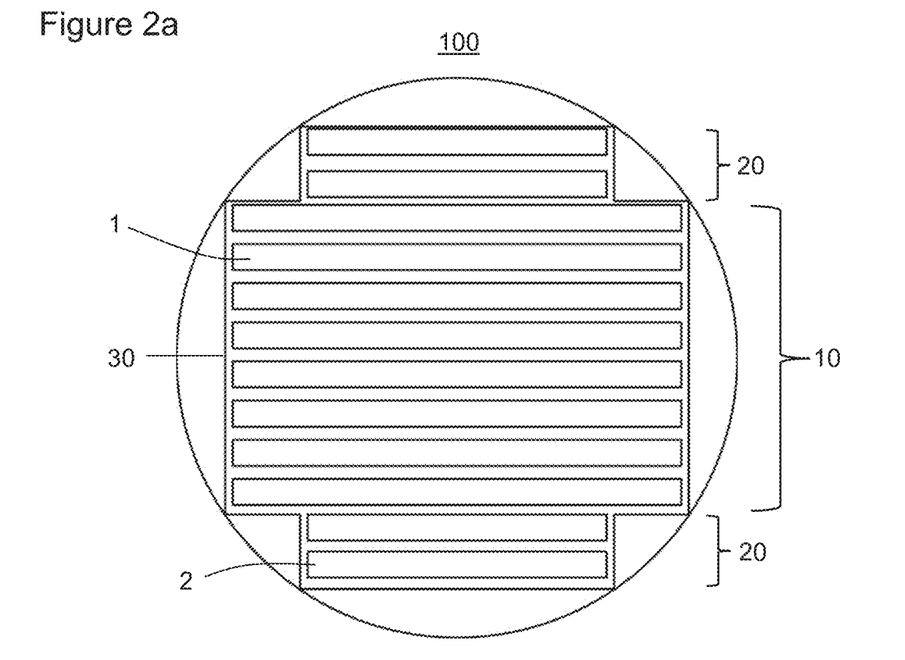
FIG. 2a shows a schematic image of the cross-section of a superconductive conductor according to the invention according to a first example.
Figure 2B:
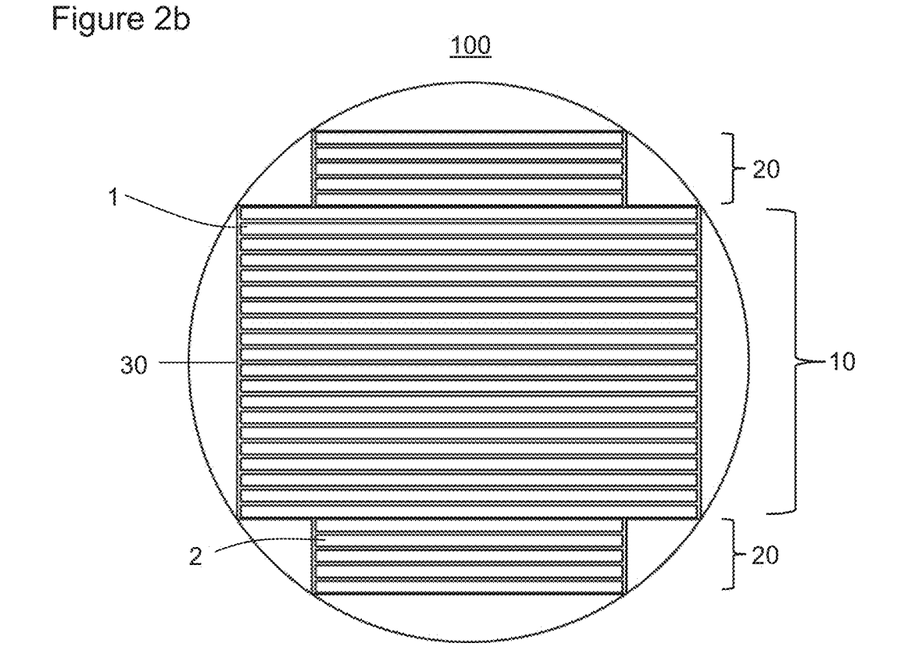
FIG. 2b shows a schematic image of the cross-section of a superconductive conductor according to the invention according to a second example.

FIGS. 2a and 2b each show a schematic image of the cross-section of a superconductive conductor 100 according to the invention. FIGS. 2a and 2b differ merely in the number of used conductive strips or superconductive strips, respectively.

In contrast to the traditional conductor of FIG. 1 the superconductive conductor 100 according to the invention comprises a plurality of first conductive strips or superconductive strips 1, respectively, and a plurality of second conductive strips or superconductive strips 2, respectively. The plurality of first conductive strips comprises at least one first superconductive strip 1 and the plurality of second conductive strips comprises at least one second superconductive strip 2. In the following, for the sake of simplicity and without loss of generality only the embodiment is considered in which all conductive strips are superconductive strips.

The first superconductive strips 1 each have a first width and the second superconductive strips each have a second width, wherein the second width is larger than the first width. The strip stack 30 formed by superconductive strips 1 and 2 thus does not have a square but a cruciform cross-section. In other words, the cross-section of the superconductive conductor 100 has the shape of a cross. For this reason, the superconductive conductor 100 according to the invention is also called cross conductor (abbr. CroCo).

Strip stack 30 can be divided into three portions, namely into a middle portion 10 and two end portions 20. In the shown embodiment of FIGS. 2a and 2b the middle portion 10, arranged between the two end portions 20, exclusively comprises first superconductive strips 1, and the two end portions 20 exclusively comprise second superconductive strips 2.

So the cross conductor according to the invention has superconductive strips, in particular REBCO strips, with two different cross-sections or widths, respectively. Therefore, the circular cross-section of a round conductor can be better exploited than in up to now implemented superconductor stacks, at the same time allowing for a simple production. The use of a cruciform superconductor strip stack instead of a square superconductor strip stack results in a significant improvement of the exploitation of the cross-section. While the geometric space factor for the square stack of FIG. 1 only is 63.6%, the geometric space factor for the strip stack with cruciform cross-section is 78.4% (calculated for a first width of 6 mm and a second width of 4 mm). The ampacity or current density, respectively, of the conductor can also be increased by the significantly better exploitation of the cross-section.

Though in principle it is possible to further increase the geometric space factor by using superconductive strips with more than two different widths and forming a strip stack whose cross-section does not have the shape of a cross but of multiple stages. However, in the framework of this invention it has shown that such a multiple stage shape can be disadvantageous in particular with regard to the twistability of the conductor. Rather, in the framework of this invention surprisingly it has shown that it is advantageous to merely use superconductive strips with exactly two different widths for the strip stack in order to thus implement a cruciform cross-section of the strip stack.

Figure 3:
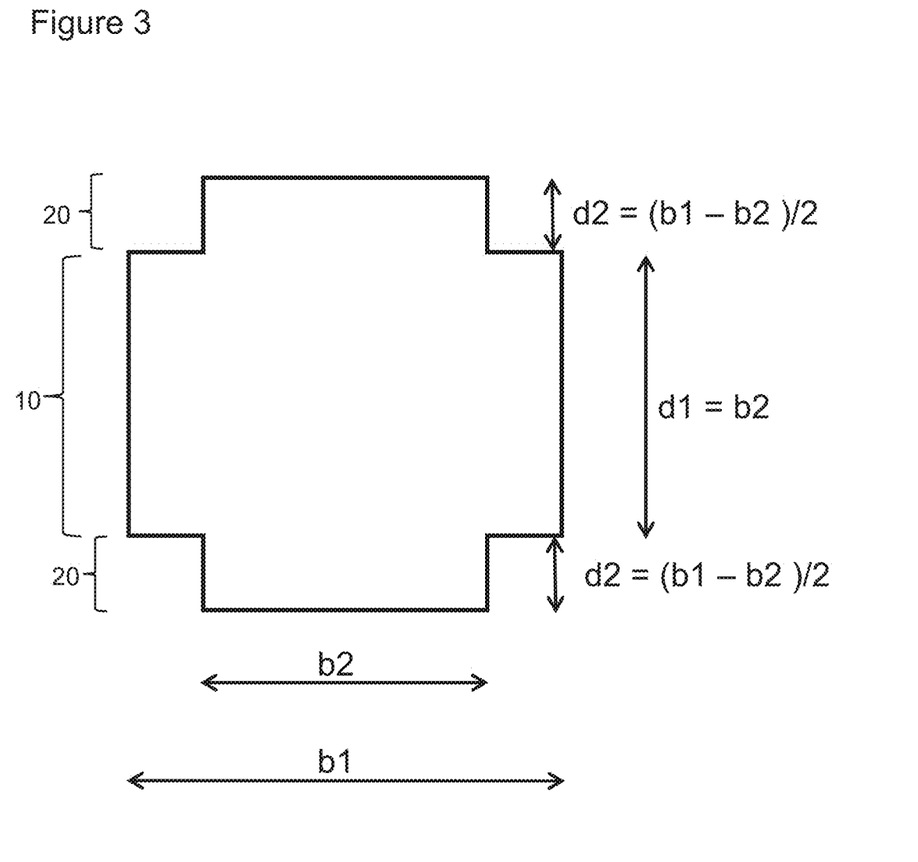
FIG. 3 shows a schematic drawing regarding the proportions of the cruciform cross-section of a superconductive conductor according to a preferred embodiment of the present invention.

FIG. 3 shows a schematic drawing regarding the proportions of the cruciform cross-section of a superconductive conductor according to the invention according to a preferred embodiment. In order to exploit the cross-section as well as possible the cross has a fourfold symmetry, i.e. the dimensions of the cross perpendicular to the strip surfaces correspond to the widths of the strips. The middle section 10 of the strip stack thus has a height $d_1$, which essentially corresponds to the width $b_2$ of the second superconductive strips 2. The end portions 20 each have a width $d_2$, which essentially corresponds to half the difference between width $b_1$ of the first superconductive strips 1 and width $b_2$ of the second superconductive strips 2. The end portions thus essentially have a height of $$d_2 = (b_1 - b_2)/2. \tag{2}$$

For $$b_2 = \frac{\sqrt{5}-1}{2}b_1 \approx 0.618 \cdot b_1 \tag{3}$$

the surface relation between cross surface to circumference surface is maximum. In this case a maximum area fill of 78.7% results. Of the suitable superconductive strips available on the market at present this ideal relationship can be approximated best by $b_1$=6 mm and $b_2$=4 mm, i.e. $b_2/b_1$=0.667. Thus a maximum area fill of 78.4% results, nearly corresponding to the theoretical maximum.

If width $b_1$ of the first superconductive strips is 6 mm and width $b_2$ of the second superconductive strips is 4 mm, the result for the number $N_1$ of the first superconductive strips in the middle portion 10 and for the number $N_2$ of the second superconductive strips in one of the end portions 20 is:

$$N_1 = 4 \text{ mm}/0.165 \text{ mm} = 24 \tag{4}$$

$$N_2 = (6 \text{ mm} - 4 \text{ mm})/0.165 \text{ mm} \approx 12 \tag{5}$$

if 0.165 mm is the thickness of the superconductive strips. In this case, the thickness of the soldering layer was not taken into account.

For instance, in total 30 to 36 strips, each of which has a thickness of ca. 150 to 165 μm, can be used for the strip stack. In this, preferably two thirds (i.e. 20 to 24) of the strips have a width of 6 mm and one third of the strips (i.e. 10 to 12) have a width of 4 mm. Taking into account the thickness of the soldering layers between the individual strips thus a thickness of the cross conductor of about 5.5 mm to 6.2 mm results, i.e. an almost fourfold symmetry of the outer shape.

Figure 4A:
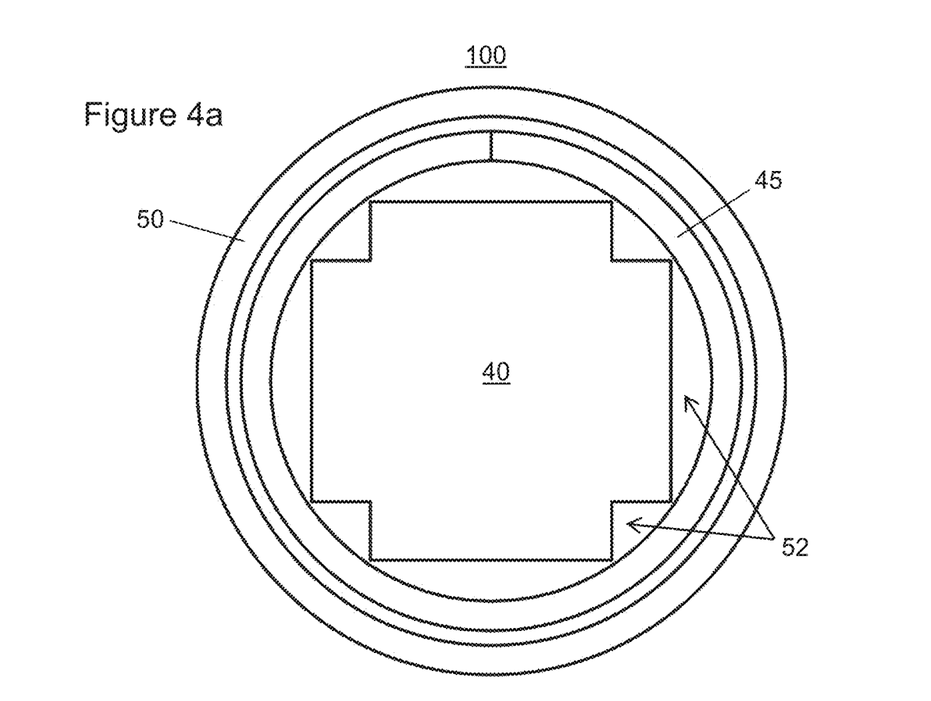
FIG. 4a shows a schematic image of the cross-section of a superconductive conductor according to the invention according to an embodiment before compacting.
Figure 4B:
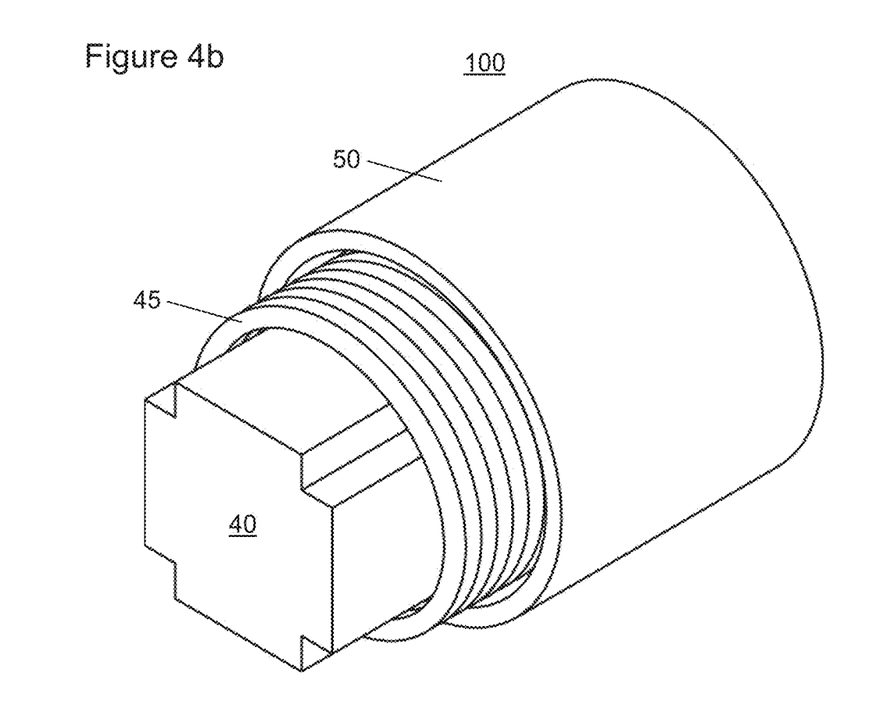

FIGS. 4a and 4b each show a schematic image of the cross-section of a superconductive conductor 100 according to the invention according to a preferred embodiment, before the conductor was compacted. In it, first of all the cruciform strip stack or the individual superconductive strips of the strip stacks, respectively, were soldered into a superconductive body 40 and inserted into a round cladding tube 50, wherein the superconductive body 40 was wrapped with a soldering wire 45 before insertion into the cladding tube 50.

Figure 5A:
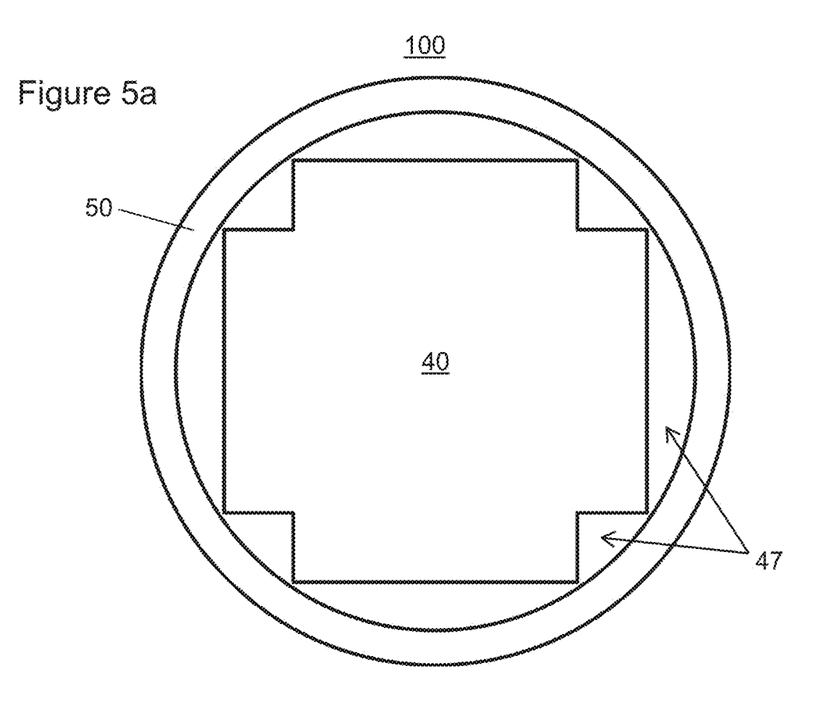
FIG. 5a shows a schematic image of the cross-section of a superconductive conductor according to the invention according to an embodiment after compacting.
Figure 5B:
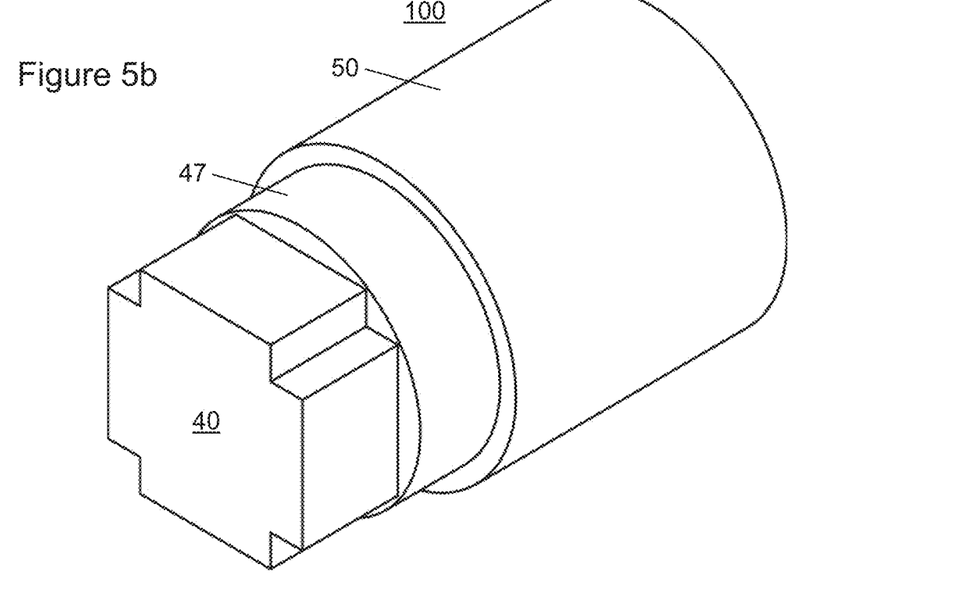
Figure 6A:
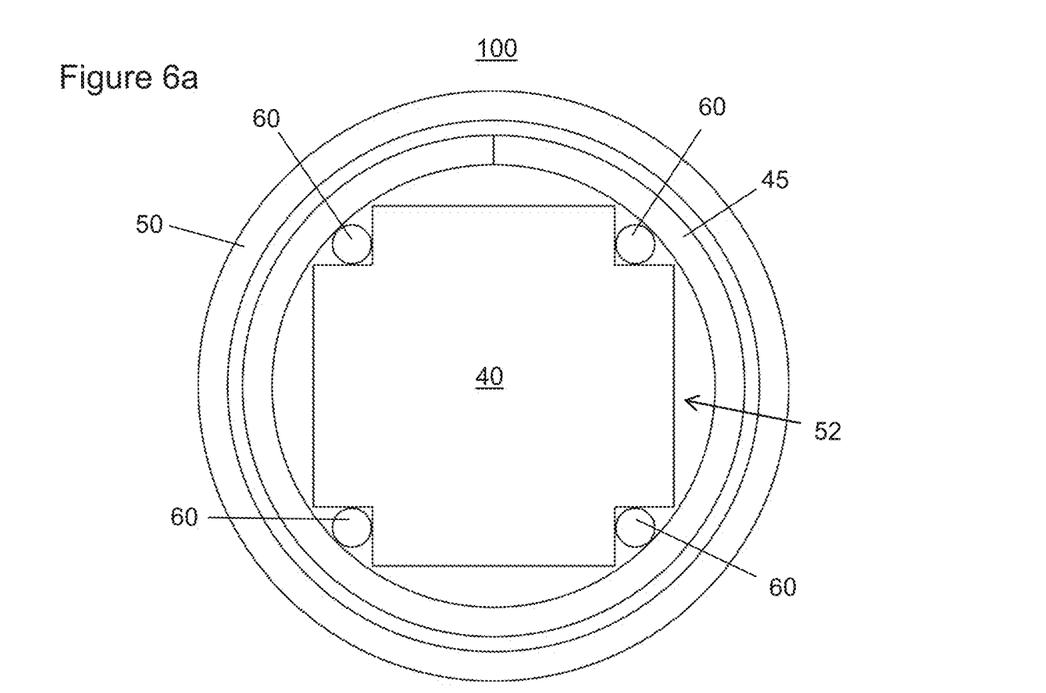
FIG. 6a shows a schematic image of the cross-section of a superconductive conductor according to the invention according to another embodiment before compacting.
Figure 6B:
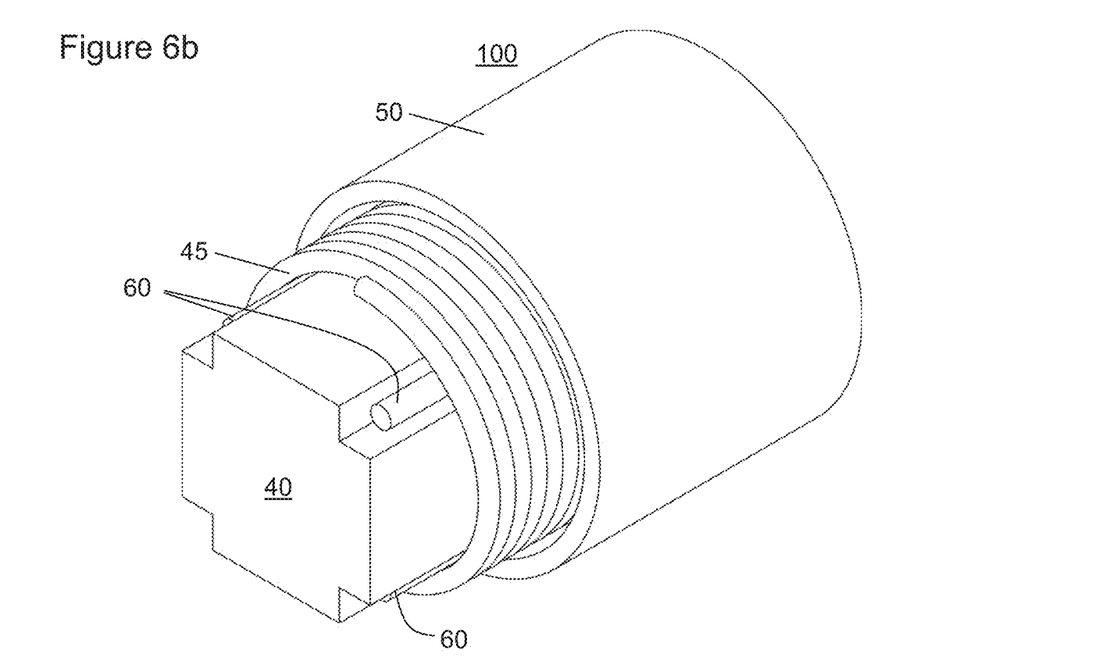
Figure 7A:
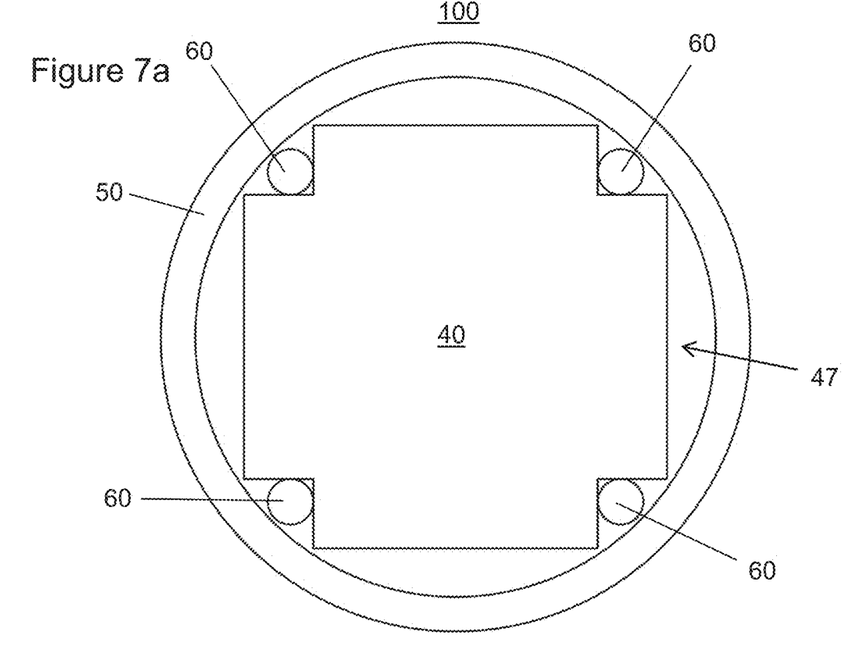
FIG. 7a shows a schematic image of the cross-section of a superconductive conductor according to the invention according to another embodiment after compacting.
Figure 7B:
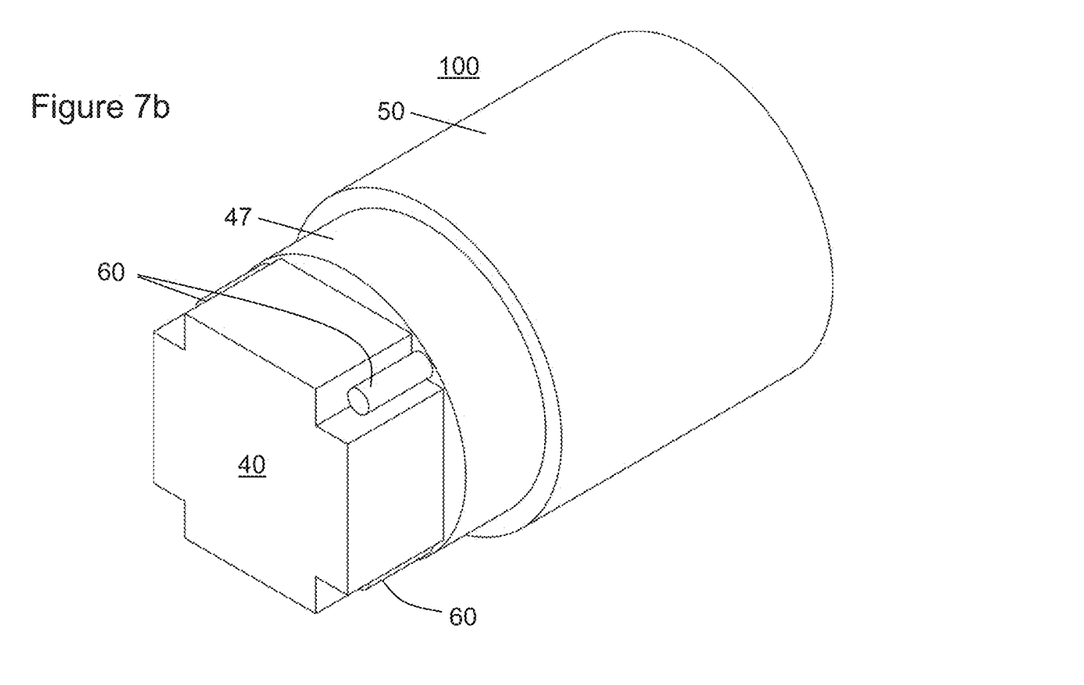

FIGS. 5a and 5b each show a schematic image of the cross-section of a superconductive conductor 100 after it was heated above the melting temperature of the soldering strip 45 and compacted with suitable methods, such as a rotary swaging and/or drawing. As is discernible from FIG. 5a and the perspective view of FIG. 5b, the soldering wire 45 of FIG. 4a or 4b, respectively, turned into an extensive soldering layer 47 between superconductive body 40 and cladding tube 50 by means of heating and/or compacting.

FIGS. 6a, 6b, 7a and 7b each correspond to FIGS. 4a, 4b, 5a and 5b with the difference that in the example of FIGS. 6a, 6b, 7a and 7b the superconductive conductor 100 comprises additional fittings 60, which were arranged together with the superconductive body 40 in the cladding tube 50 or inserted into cladding tube 50, respectively. In this way, the stability can be increased and soldering agent be saved.

As an alternative or addition to the soldering wire 45 the superconductive body 40 can be wrapped with other or further, respectively, wires or strips, e.g. with metal wires made of copper, aluminum and/or brass, or with steel wires. Such additional wires can ensure or increase, respectively, the stability and/or conductivity, in particular in a quench case.

Figure 8A:
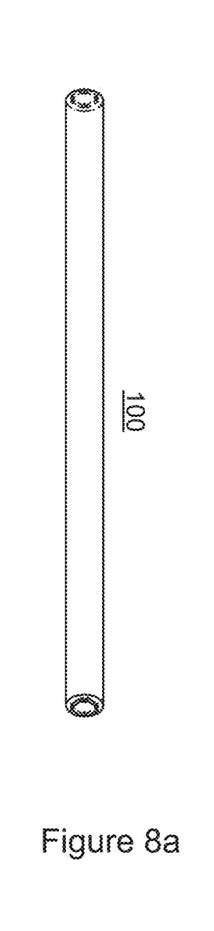
FIGS. 8a-8d show schematic images of different arrangements of one or more superconductive conductors according to the invention for forming a combination or cable, respectively.
Figure 8B:
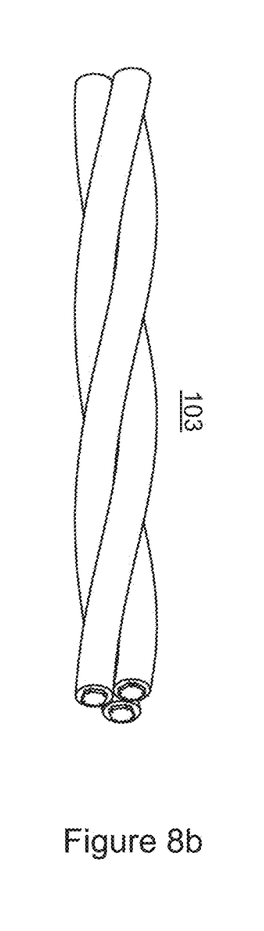
Figure 8C:
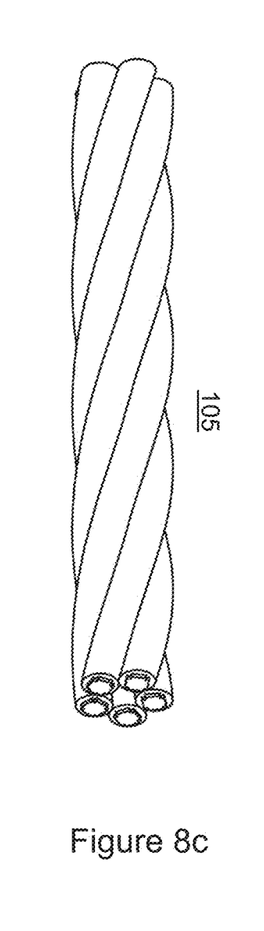
Figure 8D:
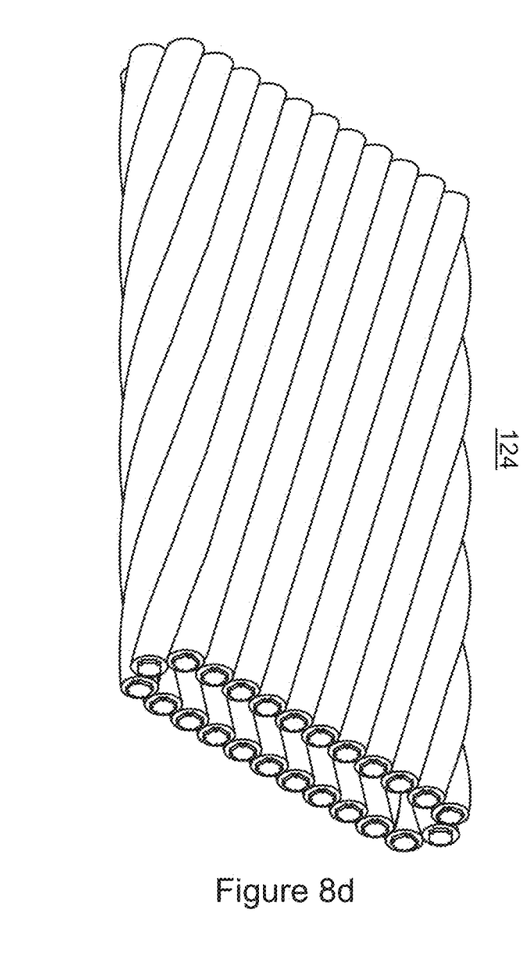

FIGS. 8a to 8d show schematic images of different arrangements of one or more superconductive conductors 100 according to the invention, in order to form a combination or cable, respectively. The cross conductor 100 according to the invention can, as shown in FIG. 8a, be used individually, or, as shown in FIGS. 8b to 8d, as cable, in particular in twisted combinations in order to increase ampacity according to the application. In FIG. 8b for instance a cable 103 with three superconductive conductors twisted with each other 100 is shown, in FIG. 8c a cable 105 with five superconductive conductors twisted with each other 100 is shown and in FIG. 8d a cable 124 with 24 superconductive conductors twisted with each other 100 is shown.

Figure 9A:
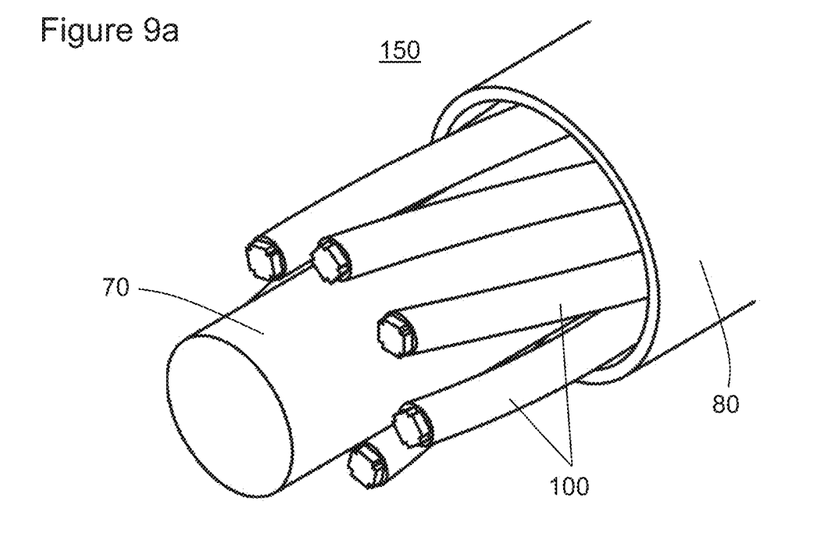
FIG. 9a shows a schematic image of a superconductive cable according to a preferred embodiment in a perspective view.
Figure 9B:
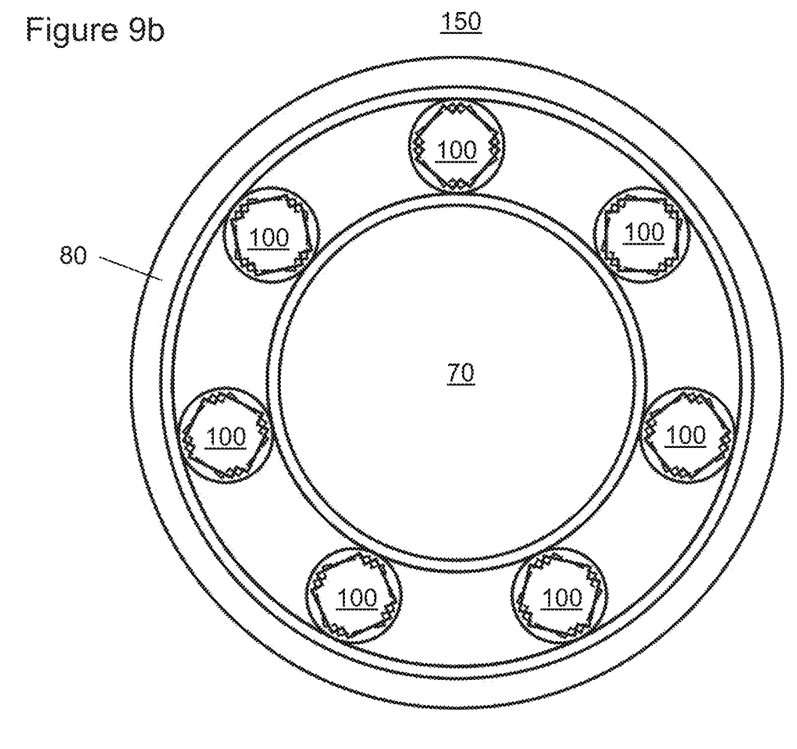
FIG. 9b shows a schematic image of a superconductive cable according to a preferred embodiment in a cross-sectional view.

As shown in FIGS. 9a and 9b by means of a cable 150, for the use of the superconductive conductor 100 for the energy transmission a number of conductors 100 adapted to the current to be transferred can be arranged around a central tube 70 or in a suitable mounting so that the stray field of the individual conductors 100 is minimized. It is possible to pump cooling agent through the tube 70 in order to cool the superconductors. In addition, as shown in FIGS. 9a and 9b, the cable 150 can be provided with a protective coat 80, which preferably is electrically insulating.

Figure 10A:
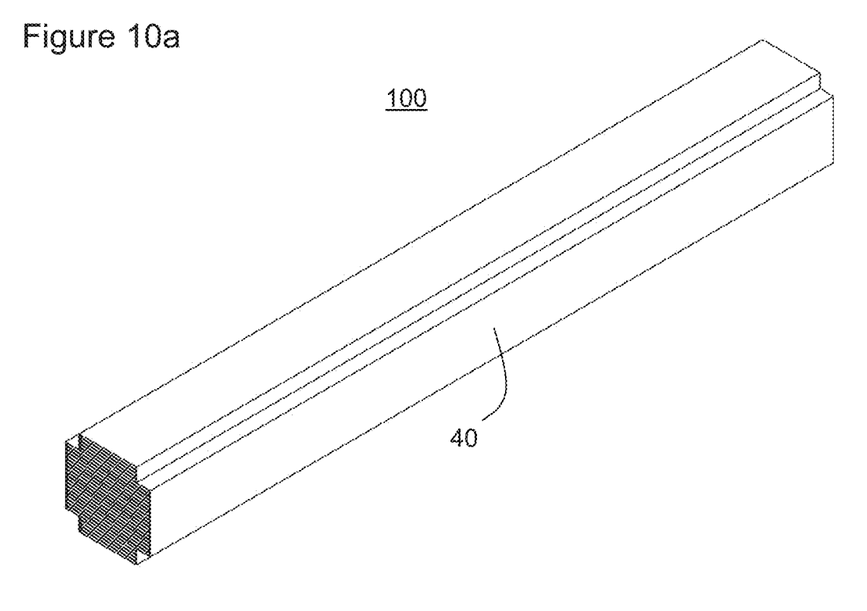
FIG. 10a shows a schematic drawing of a superconductive conductor according to an embodiment without twisting.
Figure 10B:
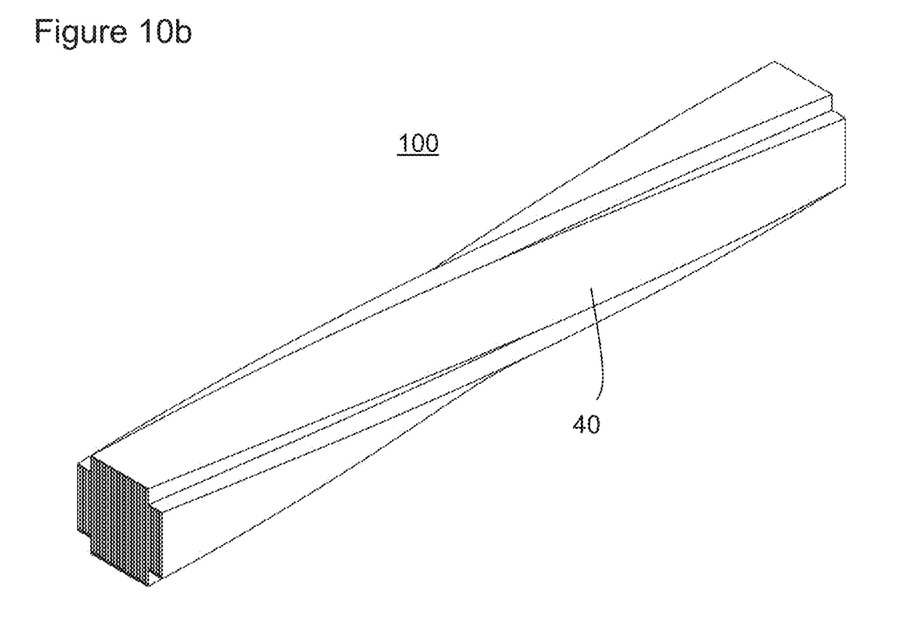
FIG. 10b shows a schematic drawing of a superconductive conductor according to an embodiment with twisting.

FIG. 10a shows a schematic drawing of a superconductive conductor 100 without twisting, whereas in FIG. 10b a schematic drawing of a superconductive conductor with twisting is shown.

The superconductive conductor 100 according to the invention, apart from high current densities, also has a good current distribution as well as low current coupling lengths by means of the uniform and reliable soldering of the superconductive strips or strip stack, respectively, in the soldering bath. Load tests or tensile tests, respectively, carried out at a temperature of 4.2 K and a magnetic field of 12 T have shown that the cross conductor according to the invention only starts degrading at loads comparable to the ones of the individual superconductive strips.

LIST OF REFERENCE SIGNS 1 first conductive strip or superconductive strip, respectively, with a first width
2 second conductive strip or superconductive strip, respectively, with a second width
3 superconductive strip
10 middle portion
20 end portion
30 strip stack of conductive strips or superconductive strips, respectively
40 superconductive body
45 soldering wire/soldering strip
47 soldering layer
50 cladding tube
52 vacuities
60 fitting
70 tube
80 protective coat
100 superconductive conductor
103 bundle of superconductive conductors/cable
105 bundle of superconductive conductors/cable
124 bundle of superconductive conductors/cable
150 bundle of superconductive conductors/cable

The invention claimed is:

1. A superconductive conductor, comprising:
a plurality of first conductive strips, each having a first width;
a plurality of second conductive strips, each having a second width; and
one or more fittings adjacent the plurality of second conductive strips,
wherein the first width differs from the second width,
wherein the plurality of first conductive strips and/or the plurality of second conductive strips comprises a plurality of superconductive strips,
wherein the plurality of first conductive strips and the plurality of second conductive strips are arranged into a strip stack with a cruciform-shaped cross section,
wherein in each case two conductive strips successively arranged in the strip stack are soldered to each other to form a superconductive body,
wherein the first width is greater than the second width,
wherein the plurality of first conductive strips and the plurality of second conductive strips arranged in a same direction,
wherein the strip stack comprises a first end, a second end, and a middle section, and
wherein the first and second ends are formed by respective ones of the plurality of second conductive strips, and the middle section is formed by the plurality of first conductive strips and has a height that corresponds to the second width, and
wherein a ratio of the second width to the first width is between 0.6 and 0.7.

2. The superconductive conductor according to claim 1, wherein the strip stack only consists of strips with two different widths.

3. The superconductive conductor according to claim 1, wherein the strip stack is formed entirely from first conductive strips with the first width and second conductive strips with the second width.

4. The superconductive conductor according to claim 1, wherein the strip stack comprises a middle section and two end sections, wherein the middle section is arranged directly between the two end sections and wherein the middle section is formed only from first conductive strips and the respective end sections are formed only from second conductive strips.

5. The superconductive conductor according to claim 1 further comprising:
a cladding tube.

6. The superconductive conductor according to claim 1, wherein the superconductive body has a twisting.

7. A method of using the superconductive conductor according to claim 1, the method comprising:
forming a cable with the superconductive conductor, the cable being suitable for the transmission of energy and/or for the generation of magnetic fields.

8. The method of claim 7, wherein the cable comprises a plurality of superconductive conductors.

9. The method of claim 7, wherein the superconductive conductor is heated locally to form a bent cable.

10. The superconductive conductor according to claim 1, further comprising:
one or more metal wires.

11. The superconductive conductor according to claim 1, further comprising:
one or more steel wires.

12. The superconductive conductor according to claim 1, further comprising:
insulating material.

13. The method of claim 8, wherein the cable comprises one or more twisted combinations of the plurality of superconductive conductors.

14. The method of claim 9, wherein the superconductive conductor is heated to or above a melting temperature of the soldering agent used in the superconductive conductor.

* * * * *